United States Patent

Liu et al.

[11] Patent Number: 5,994,225
[45] Date of Patent: Nov. 30, 1999

[54] METHOD OF ETCHING METAL WITH INCREASED ETCHING SELECTIVITY

[75] Inventors: Ming-Tsung Liu, Hsinchu; Tsung-Yuan Hung, Tainan; Bill Hsu, Hsinchu, all of Taiwan

[73] Assignee: United Microelectronics Corp., Hsinchu, Taiwan

[21] Appl. No.: 08/733,476

[22] Filed: Oct. 18, 1996

[30] Foreign Application Priority Data

Sep. 10, 1996 [TW] Taiwan ................................. 85111067

[51] Int. Cl.$^6$ .................................................. H01L 21/302
[52] U.S. Cl. .......................... 438/694; 438/705; 438/720; 438/742; 438/783; 438/976; 430/318
[58] Field of Search ..................................... 438/694, 700, 438/703, 705, 720, 742, 949, 976, 780, 781, 783; 430/318

[56] References Cited

U.S. PATENT DOCUMENTS

| | | | |
|---|---|---|---|
| 4,068,018 | 1/1978 | Hashimoto et al. | 427/38 |
| 4,289,574 | 9/1981 | Radigan et al. | 156/643 |
| 4,390,394 | 6/1983 | Mathuni et al. | 156/643 |
| 4,474,642 | 10/1984 | Nakane et al. | 156/643 |
| 4,915,779 | 4/1990 | Srodes et al. | 156/643 |
| 5,369,053 | 11/1994 | Fang | 437/194 |
| 5,651,860 | 7/1997 | Li | 156/659.11 |
| 5,702,566 | 12/1997 | Tsui | 156/643.1 |
| 5,726,102 | 3/1998 | Lo | 438/718 |

FOREIGN PATENT DOCUMENTS 63-133629 A2  6/1988  Japan .
8-153714 A2  6/1996  Japan .

OTHER PUBLICATIONS

Shone, F. et al, "Gate oxide charging and its elimination for metal antenna capacitor and transistor in VLSI CMOS double layer metal technology" 1989 Symposium on VLSI Technology, pp. 73–74, Jun. 1988.

Wolf, S. et al, Silicon Processing for the VLSI Era, vol. 1, pp. 311–314, 321–324, 1986.

*Primary Examiner*—Bruce Breneman
*Assistant Examiner*—Anita Alanko
*Attorney, Agent, or Firm*—Rabin & Champagne, P.C.

[57] ABSTRACT

A method for etching metal which can increase the metal-to-photoresist etching selectivity of a metal layer aimed to be etched with respect to a photoresist layer overlaying the metal layer. The method includes a first step of forming a cap oxide layer over the metal layer; a second step of forming a photoresist layer with a desired pattern over the cap oxide layer; a third step of conducting an ion implantation process on the photoresist layer; and a final step of conducting an etching process on the semiconductor wafer by using the photoresist layer as a mask so as to etch away exposed portions of the metal layer that are uncovered by the photoresist layer. Through experiments, it is found that the invention provides a significantly improved etching selectivity over the prior art.

13 Claims, 2 Drawing Sheets

METHOD OF ETCHING METAL WITH INCREASED ETCHING SELECTIVITY

BACKGROUND OF THE INVENTION

1. Field of the Invention

This invention relates to methods for etching metal in semiconductor fabrications, and more particularly, to a method for etching metal with increased etching selectivity.

2. Description of Related Art

In semiconductor fabrications, etching is an essential step which is used to remove unwanted portions of either a metal layer, a semiconductor layer, or a photoresist layer during the photolithographic process. There are two primary types of etching: wet etching and dry etching. Wet etching is conducted by using chemical solutions and is therefore isotropic to the layer being etched since it often causes undercuts beneath the layer being etched. By contrast, dry etching is conducted using plasma and therefore is anisotropic to the layer being etched making dry etching more suitable for use in high precision mask processes.

In designing and use of the dry etching, it is desired that the etching be primarily directed to the downward direction and minimally to the lateral direction so that the transferred pattern on the wafer can be substantially the same in size as the original pattern on the mask and an undercut can be avoided. In other words, the ratio of the downward etching rate to the lateral etching rate should be as large as possible. The ratio of the etching rate on the layer aimed to be etched to the etching rate on the nearby layer is referred to as "etching selectivity". However, since the anisotropic characteristic of dry etching is owing to the bombardment of particles on the wafer, the etching will not only take place on the layer aimed to be etched, but also on the overlaying photoresist layer. The etching removal of part of the photoresist layer will cause a deviation in the size of the pattern being defined by the photoresist layer, thus giving a poor etching selectivity that is even lower than that achieved by wet etching. A large value for the etching selectivity indicates that the etching mainly takes place on the layer aimed to be etched and minimally on the nearby layers. Therefore, although dry etching can give high precision to the pattern being transferred, it nevertheless gives poor etching selectivity. The following will depict this drawback illustratively.

FIGS. 1A through 1C are sectional diagrams depicting the steps involved in a prior art method for etching metal. Referring first to FIG. 1A, a metal layer 12 is deposited over an insulating layer 10. The insulating layer 10 is, for example, a layer of borophosphosilicate glass (BPSG).

Referring next to FIG. 1B, a photoresist layer 14 is formed over the metal layer 12. The photoresist layer 14 is selectively removed by a photolithographic process so as to define a desired pattern.

Referring further to FIG. 1C, a dry etching process is conducted on the wafer so as to remove the exposed portions of the metal layer 12 that are uncovered by the photoresist layer 14. Through this process, the exposed portions of the metal layer 12 as well as part of the photoresist layer 14 will be etched away. After that, the photoresist layer 14 is removed and the remaining wafer is as that shown in FIG. 1C.

By the foregoing etching process, the etching rate to the metal layer 12 is relatively low compared to the etching rate to the photoresist layer 14, thus giving a very poor metal-to-photoresist etching selectivity. In order to allow the transferred pattern to be precise in size, a solution is to increase the thickness of the photoresist layer. However, this will equally reduce the size of the process window for the photolithographic process.

Another solution is to use high-current implantor (HI-implantor) to diffuse arsenic (As) ions in the photoresist layer so that the photoresist layer can be more resistant to etching. This can increase the metal-to-photoresist etching selectivity. However, a drawback to this solution is that, during the implantation, the bombarding ions will strike metal ions away from and off the metal layer, thus causing the implantor to be polluted by these metal ions. There exists, therefore, a need for a new and improved method for etching metal which not only increases the metal-to-photoresist etching selectivity, but also prevents the implantor from being polluted by metal ions.

SUMMARY OF THE INVENTION

It is therefore a primary objective of the present invention to provide a method for etching metal which can increase the metal-to-photoresist etching selectivity.

It is a further objective of the present invention to provide a method for etching metal which can prevent the implantor from being polluted by metal ions.

In accordance with the foregoing and other objectives of the present invention, a new and improved method for etching metal is provided. The method includes a first step of forming a thin cap oxide layer over the metal layer; a second step of forming a photoresist layer with a desired pattern over the thin cap oxide layer; a third step of conducting an ion implantation process on the photoresist layer; and a final step of conducting an etching process on the semiconductor wafer by using the photoresist layer as a mask so as to etch away exposed portions of the metal layer that are uncovered by the photoresist layer. Through experiments, it is found that the invention provides a significantly improved etching selectivity over the prior art.

BRIEF DESCRIPTION OF DRAWINGS

The invention can be more fully understood from the following detailed description of the preferred embodiments, with references made to the accompanying drawings, wherein.

DETAILED DESCRIPTION OF PREFERRED EMBODIMENT

Figure 1A:
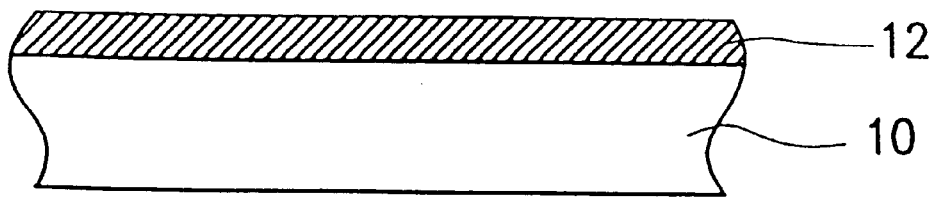
FIGS. 1A through 1C are sectional diagrams used to depict the steps involved in a prior art method for etching metal.
Figure 1B:
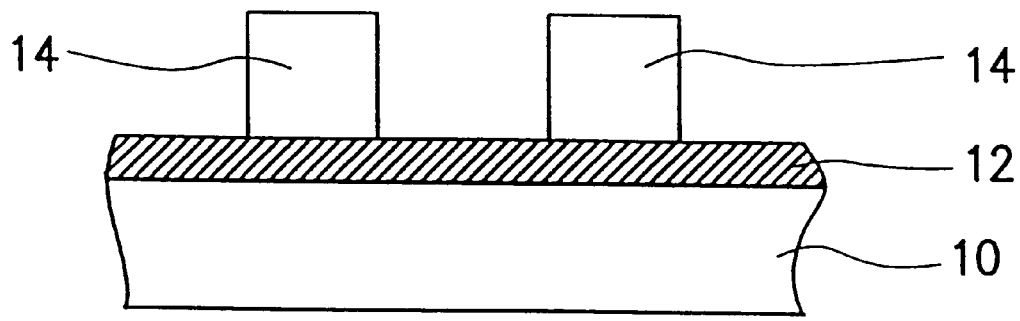
Figure 1C:
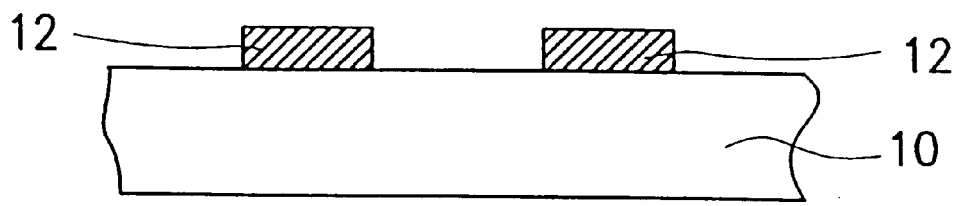
Figure 2A:
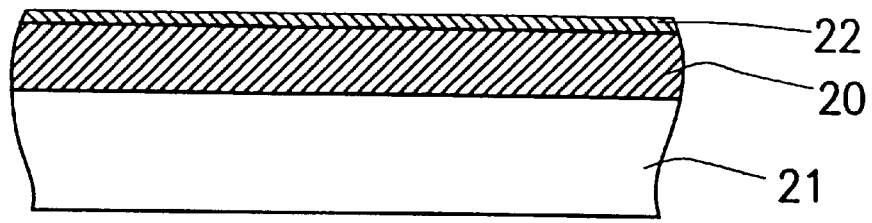
FIGS. 2A through 2C are sectional diagrams used to depict the steps involved in the method according to the present invention for etching metal.
Figure 2B:
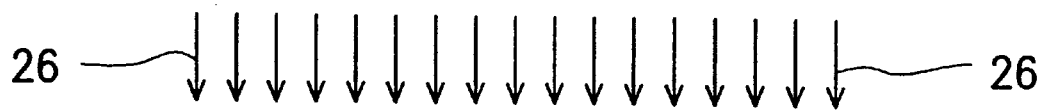
Figure 2B:
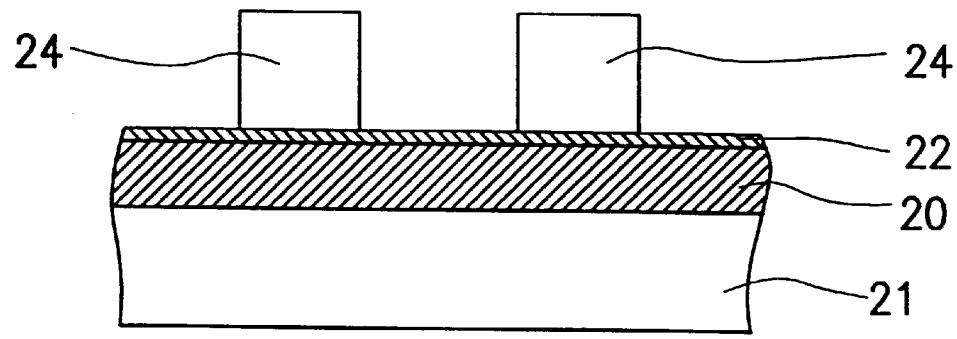
Figure 2C:
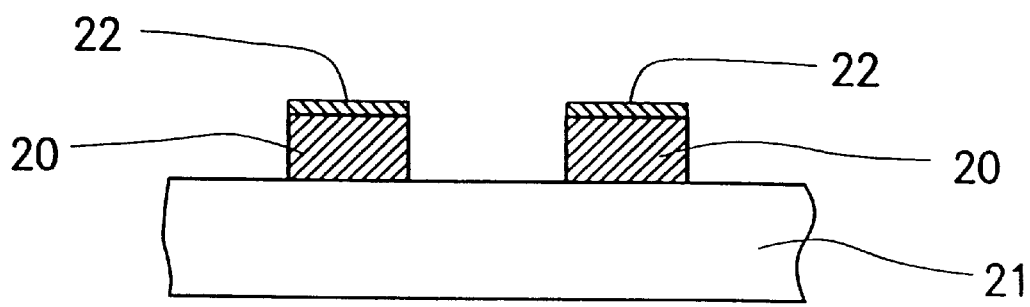

FIGS. 2A through 2C are sectional diagrams depicting the steps involved in the method according to the present invention for etching metal.

Referring first to FIG. 2A, a metal layer 20 is formed over an insulating layer 21. The insulating layer 21 can be, for example, a layer of borophosphosilicate glass (BPSG). After that, a thin cap oxide layer 22 is formed over the metal layer 20 to a thickness of about 200 to 300 Å(angstrom), for example. The cap oxide layer 22 can be, for example, a layer of silicon oxide formed by plasma enhanced chemical-vapor deposition (PECVD) and is used to prevent metal ions from being bombarded out of the metal layer 20 in the subsequent ion implantation process.

Referring next to FIG. 2B, a photoresist layer 24 is coated over the thin cap oxide layer 22. After that, a photolithographic process is conducted to transfer the pattern on a mask onto the photoresist layer 24, and UV-curing is conducted to harden the pattern defined by the photoresist layer 24. The photoresist layer 24, as that illustrated in FIG. 2B, is then used as a mask in the subsequent step to etch the metal layer 20. After that, an ion implantation process using a high-current implantor such as the NV-10 implantor supplied by the Eaton Corporation of USA is conducted on the wafer of FIG. 2B so as to diffuse $As^{75}$ ions with an energy of about 80 KeV and a concentration of $5 \times 10^{15}$ atoms/cm² into the photoresist layer 24. This process can effectively harden the photoresist layer 24 and increase the etching selectivity of the metal layer 20 with respect to the photoresist layer 24 in the subsequent etching process.

Referring further to FIG. 2C, the exposed portions of the thin cap oxide layer 22, which are uncovered by the photoresist layer 24, are removed. After that, an etching process such as dry etching is conducted on the wafer so as to remove the exposed portions of the metal layer 20 that are uncovered by the photoresist layer 24. Finally, the photoresist layer 24 is removed and a wafer structure, as that shown in FIG. 2C, is obtained.

From the foregoing disclosure, it is apparent to those skilled in the art of semiconductor technology that the invention has the following advantages: First, the thin cap oxide layer 22 serves as a cover that prevents metal ions from being bombarded out of the metal layer 20. Additionally, the thickness of the thin cap oxide layer 22 can be adjusted in accordance with various ion implantation processes so as to be thick enough to shield the metal ions from the metal layer 20. Second, since the metal layer 20 is covered by the cap oxide layer 22, the metal layer 20 will not be subjected to the so-called "antenna effect" during the ion implantation process when ions are being bombarded into the photoresist layer 24. Third, since the metal layer 20 is covered by the thin cap oxide layer 22, the metal layer 20 will not be subjected to the so-called "antenna effect" when the photoresist layer 24 is being removed. Fourth, the ion implantation on the photoresist layer 24 will significantly increase the etching selectivity of the metal layer 20 with respect to the photoresist layer 24. Therefore, under the same etching recipe, the thickness of the photoresist layer 24 can be reduced, but nonetheless obtain the transferred pattern with high precision. Fifth, the thickness of the photoresist layer 24 can be reduced to maintain the size of the process window for the photolithographic process.

Through experiments, the following results have been obtained.

(1) With prior art method, a photoresist layer having an original thickness of 19.8 K Å is left with a thickness of 7.9 K Å after the etching of the metal layer. The metal-to-photoresist etching selectivity is about ⅔.

(2) By contrast, after etching the metal layer by the method of the invention, the same photoresist layer of an original thickness of 19.8 K Å is left with a thickness of 13.6 K Å. The metal-to-photoresist etching selectivity is about 4/3.

(3) Moreover, by the method of the invention, if it is desired that photoresist layer after etching have a remaining thickness of 8.3 K Å, the original photoresist layer need only be coated only to a thickness of 14.3 K Å, which is significantly less than that required by the prior art method.

From the first and second results, it is shown that with the same thickness for the photoresist layer, the metal-to-photoresist etching selectivity achieved by the invention is improved by about two times better than that achieved by the prior art. Moreover, from the first and third results, it can be learned that to obtain a photoresist layer of a desired fixed thickness after etching, the invention allows the original photoresist layer to be coated with a smaller thickness, which is about 30% less, than the thickness required by the prior art method. In conclusion, the invention provides a significantly improved etching selectivity over the prior art.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method of etching a metal layer on a semiconductor wafer, comprising:
   forming a thin cap oxide layer to a thickness not to exceed approximately 300 Å over the metal layer;
   forming a photoresist layer with a desired pattern over the thin cap oxide layer;
   implanting ions into the photoresist layer and the thin cap oxide layer; and
   using the photoresist layer as a mask, etching the semiconductor wafer so as to remove portions of the metal layer not covered by the photoresist layer.

2. The method of claim 1, wherein the implanting ions includes implanting ions with a high-current implantor.

3. The method of claim 1, wherein the implanting ions includes implanting arsenic ions.

4. The method of claim 1, wherein the implanting ions includes implanting ions with an energy of about 80 KeV and a concentration of about $5 \times 10^{15}$ atoms/cm².

5. The method of claim 1, wherein forming a thin cap oxide layer includes forming a thin cap oxide layer on the metal layer.

6. The method of claim 1, wherein the forming a photoresist layer includes forming a photoresist layer on the thin cap oxide layer.

7. A method for etching a metal layer on a semiconductor wafer, comprising:
   forming a cap oxide layer to a thickness of about 200 Å to 300 Å over the metal layer;
   forming a photoresist layer with a desired pattern over the cap oxide layer;
   conducting an ion implantation process on the photoresist layer; and
   using the photoresist layer as a mask, conducting an etching process on the semiconductor wafer so as to etch away exposed portions of the metal layer that are uncovered by the photoresist layer.

8. The method of claim 7, wherein the cap oxide layer is a layer of silicon oxide.

9. A method for etching a metal layer on a semiconductor wafer, comprising the steps of:
   (1) forming a silicon oxide layer over the metal layer to a thickness of about 200 to 300 Å;
   (2) forming a photoresist layer with a desired pattern over the silicon oxide layer;
   (3) conducting an ion implantation process on the photoresist layer: and (4) using the photoresist layer as a mask, conducting an etching process on the semiconductor wafer so as to etch away exposed portions of the metal layer that are uncovered by the photoresist layer.

10. The method of claim 7, wherein the ion implantation process includes use of a high-current implantor.

11. The method of claim 7, wherein the ion implantation process uses arsenic (As) ions as dopant.

12. The method of claim 1, wherein the ion implantation process is conducted with an energy of about 80 KeV and a concentration of $5\times10^{15}$ atoms/cm$^2$.

13. The method of claim 1, wherein the conducting an implantation process includes conducting an ion implantation process on the cap oxide layer.

* * * * *